(12) United States Patent
Wood et al.

(10) Patent No.: US 8,187,983 B2
(45) Date of Patent: May 29, 2012

(54) METHODS FOR FABRICATING SEMICONDUCTOR COMPONENTS USING THINNING AND BACK SIDE LASER PROCESSING

(75) Inventors: Alan G. Wood, Boise, ID (US); Tim Corbett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 12/424,726

(22) Filed: Apr. 16, 2009

(65) Prior Publication Data
US 2010/0264423 A1 Oct. 21, 2010

(51) Int. Cl.
*H01L 21/00* (2006.01)

(52) U.S. Cl. ............... 438/795; 438/463; 257/E21.347; 257/E23.179; 257/E29.108

(58) Field of Classification Search .................. 438/462, 438/463, 464, 113, 118, 692, 795; 257/622, 257/E29.108, E23.179, E21.517, E21.599, 257/E21.347
See application file for complete search history.

(56) References Cited

U.S. PATENT DOCUMENTS

| 4,668,304 | A | | 5/1987 | Schachameyer et al. |
| 4,906,314 | A | | 3/1990 | Farnworth et al. |
| 5,322,988 | A | | 6/1994 | Russell et al. |
| 5,922,224 | A | * | 7/1999 | Broekroelofs ........... 219/121.72 |
| 6,107,109 | A | | 8/2000 | Akram et al. |
| 6,509,546 | B1 | * | 1/2003 | Egitto et al. ............. 219/121.68 |
| 6,638,358 | B1 | | 10/2003 | You et al. |
| 6,676,878 | B2 | | 1/2004 | O'Brien et al. |
| 6,734,032 | B2 | | 5/2004 | Tandy et al. |
| 6,734,387 | B2 | | 5/2004 | Kafka et al. |
| 6,737,606 | B2 | | 5/2004 | Peng et al. |
| 6,924,210 | B1 | | 8/2005 | Daubenspeck et al. |
| 6,927,167 | B2 | * | 8/2005 | Fukuda et al. ................ 438/689 |
| 7,041,578 | B2 | * | 5/2006 | Mahle et al. ................. 438/462 |
| 7,049,700 | B2 | | 5/2006 | Hembree et al. |

(Continued)

FOREIGN PATENT DOCUMENTS

JP 58064029 A * 4/1983

(Continued)

OTHER PUBLICATIONS

Irving et al, "Wafer Deposition/Metallization and Back Grind, Process-Induced Warpage Simulation" 2003, Electronic Components and Technololgy Conference, pp. 1459-1462.*

(Continued)

*Primary Examiner* — Matthew Landau
*Assistant Examiner* — Joseph C Nicely
(74) *Attorney, Agent, or Firm* — Stephen A. Gratton

(57) ABSTRACT

A method for fabricating semiconductor components includes the steps of providing a semiconductor substrate having a circuit side, a back side and integrated circuits and circuitry on the circuit side; thinning the substrate from the back side to a selected thickness; laser processing the back side of the thinned substrate to form at least one lasered feature on the back side; and dicing the substrate into a plurality of components having the lasered feature. The lasered feature can cover the entire back side or only selected areas of the back side, and can be configured to change electrical properties, mechanical properties or gettering properties of the substrate. A semiconductor component includes a thinned semiconductor substrate having a back side and a circuit side containing integrated circuits and associated circuitry. The semiconductor component also includes at least one lasered feature on the back side configured to provide selected electrical or physical characteristics for the substrate.

19 Claims, 8 Drawing Sheets

U.S. PATENT DOCUMENTS

| | | | |
|---|---|---|---|
| 7,095,761 B2 | 8/2006 | Um | |
| 7,118,992 B2 | 10/2006 | Turner et al. | |
| 7,129,156 B2 | 10/2006 | Akram et al. | |
| 7,138,297 B2 | 11/2006 | Iijima et al. | |
| 7,157,038 B2 | 1/2007 | Baird et al. | |
| 7,224,051 B2 | 5/2007 | Farnworth et al. | |
| 7,256,108 B2 | 8/2007 | Park et al. | |
| 7,291,874 B2 | 11/2007 | Hsu | |
| 7,307,348 B2 | 12/2007 | Wood et al. | |
| 7,473,582 B2 | 1/2009 | Wood et al. | |
| 7,498,675 B2 | 3/2009 | Farnworth et al. | |
| 7,582,513 B2* | 9/2009 | Kroeninger et al. | 438/114 |
| 7,645,685 B2* | 1/2010 | Ishizuka et al. | 438/460 |
| 7,737,567 B2* | 6/2010 | Bonora et al. | 257/797 |
| 7,759,224 B2* | 7/2010 | Miyazaki et al. | 438/464 |
| 7,871,899 B2* | 1/2011 | Rinne et al. | 438/457 |
| 7,919,787 B2* | 4/2011 | Lee et al. | 257/99 |
| 7,939,916 B2* | 5/2011 | O'Donnell et al. | 257/659 |
| 8,014,154 B2* | 9/2011 | Lee | 361/749 |
| 2003/0052102 A1 | 3/2003 | Amako et al. | 219/121.75 |
| 2004/0013149 A1* | 1/2004 | Hanaoka | 372/46 |
| 2004/0046288 A1* | 3/2004 | Chou | 264/479 |
| 2004/0124184 A1* | 7/2004 | An et al. | 219/121.66 |
| 2005/0151138 A1* | 7/2005 | Slater et al. | 257/79 |
| 2005/0227379 A1* | 10/2005 | Donofrio | 438/4 |
| 2006/0076649 A1* | 4/2006 | Letertre et al. | 257/619 |
| 2006/0249480 A1 | 11/2006 | Boyle | |
| 2007/0004211 A1* | 1/2007 | Kim et al. | 438/692 |
| 2007/0131967 A1* | 6/2007 | Kawaguchi et al. | 257/190 |
| 2007/0155131 A1* | 7/2007 | Contes | 438/458 |
| 2007/0178631 A1* | 8/2007 | Tanaka | 438/166 |
| 2007/0272940 A1* | 11/2007 | Lee et al. | 257/99 |
| 2008/0011852 A1* | 1/2008 | Gu et al. | 235/454 |
| 2008/0067155 A1* | 3/2008 | Gu | 219/121.62 |
| 2008/0067159 A1* | 3/2008 | Zhang et al. | 219/121.84 |
| 2008/0073438 A1* | 3/2008 | Gu et al. | 235/494 |
| 2008/0094640 A1* | 4/2008 | Cordingley et al. | 356/614 |
| 2008/0153262 A1* | 6/2008 | Lee et al. | 438/462 |
| 2008/0179611 A1 | 7/2008 | Chitnis et al. | |
| 2008/0211045 A1* | 9/2008 | Ono | 257/432 |
| 2008/0296754 A1* | 12/2008 | Hua et al. | 257/712 |
| 2008/0302481 A1 | 12/2008 | Berger et al. | |
| 2009/0001616 A1* | 1/2009 | Bonora et al. | 257/797 |
| 2009/0137085 A1* | 5/2009 | Tsukano et al. | 438/121 |
| 2009/0186435 A1* | 7/2009 | Yeh et al. | 438/29 |
| 2010/0055878 A1* | 3/2010 | Maki et al. | 438/464 |
| 2010/0092718 A1* | 4/2010 | Shin et al. | 428/66.4 |
| 2010/0120202 A1* | 5/2010 | Wu et al. | 438/113 |
| 2010/0148360 A1* | 6/2010 | Lin et al. | 257/737 |
| 2010/0151678 A1* | 6/2010 | Dydyk et al. | 438/665 |
| 2010/0216281 A1* | 8/2010 | Pagaila et al. | 438/107 |
| 2010/0219171 A1* | 9/2010 | Sato et al. | 219/121.75 |
| 2011/0028003 A1* | 2/2011 | Wang et al. | 438/795 |
| 2011/0128980 A1* | 6/2011 | Kato | 372/43.01 |
| 2011/0147760 A1* | 6/2011 | Ogihara et al. | 257/76 |

FOREIGN PATENT DOCUMENTS

| | | | |
|---|---|---|---|
| JP | 63166276 A | * | 7/1988 |
| JP | 2001274048 A | * | 10/2001 |

OTHER PUBLICATIONS

M. C. Muller et al., "Significant Step in Wafer Yield Optimization and Operation Cost Reduction Due to Dicing Innovation", CS MANTECH Conference, Apr. 24-27, 2008, Vancouver, British Columbia, Canada, pp. 141-144.

Kurisu Kenichi et al. "Development of a Diffractive Optical Element for Laser Processing", Itami R&D Laboratories, SEI Technical Review, No. 53, Jan. 2002 pp. 1-6.

Bourdon H. et al., Investigation of Excimer Laser Annealing of Si using PhotoLuminescence at Room Temperature, RTP-2007 Catania, Oct. 2007, pp. 1-24.

Dr. Heinrich Endert, "Emerging Applications of Laser in Micromachining", Newport Corporation, Spectra Physics, Mountain View, CA, date unavailable, pp. 1-57.

U.S. Appl. No. 61/113,872, filed Nov. 12, 2008, Flat Plane Wafer Control Method by MEMS Process, pp. 1-8.

* cited by examiner

METHODS FOR FABRICATING SEMICONDUCTOR COMPONENTS USING THINNING AND BACK SIDE LASER PROCESSING

BACKGROUND

Semiconductor components, such as dice, packages and interconnects are being made thinner than previous generation components. At the same time, electrical and packaging requirements for semiconductor components are becoming more stringent. Typically, semiconductor components are thinned from the back side at the wafer level using a process such as grinding or chemical mechanical planarization (CMP). For example, a standard 200 mm (8 inch) diameter semiconductor wafer has a thickness of about 725 µm. During fabrication, the wafer can be thinned to a thickness of about 100 µm or less.

Back side thinning of a semiconductor wafer can cause problems during wafer level processes, during component fabrication processes, and in the singulated components as well. One problem is that the thinned wafer can bow due to stresses generated by the circuitry formed on the circuit side (face) of the wafer. In this case, a thinned wafer oriented circuit side up can bow upward in the shape of a smile (i.e., generally convex shape), causing carrier adhesion, wafer handling and alignment issues during component fabrication. A singulated component from a thinned wafer can also bow upward towards the circuit side, and from the corners towards the center of the component. Bowed components can be more difficult to mount, particularly in flip chip and stacking applications. For example, terminal contacts on a bowed flip chip or stacked component can pull away from mating electrodes or contacts on a substrate or adjacent component.

Another problem caused by thinning is that the back side of a thinned semiconductor component can have a smooth, polished surface, reducing the number of defect sites. The defect sites can trap contaminants in the semiconductor substrate and can also act as carrier generation and recombination centers. The contaminants can adversely affect the minority carrier lifetime electrons of the semiconductor devices changing functionality and certain defect mechanisms. One technique for attracting contaminants is to deposit a gettering agent, such as a spin-on dopant, on the back side of a component. However, relatively high temperatures (e.g., >800° C.) are required to drive the dopant into the semiconductor substrate. A thinned semiconductor component typically includes circuitry on the circuit side, which cannot be subjected to high temperatures. For this reason, thinned semiconductor components do not usually employ an extrinsic back side gettering layer due to the difficulties in applying this layer. In addition, thinned semiconductor components can have different electrical characteristics and a different functionality than full thickness components.

In view of the foregoing, improved thinned semiconductor components, and improved methods for fabricating thinned semiconductor components are needed in the art. However, the foregoing examples of the related art and limitations related therewith, are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

As used herein, "semiconductor component" means an electronic element that includes a semiconductor substrate having integrated circuits and semiconductor devices. "Interconnect" means an electrical element that makes electrical contact with a semiconductor component or an embedded circuitry. "Wafer-level" means a process conducted on an element, such as a semiconductor wafer, containing multiple semiconductor components. "Wafer size" means having an outline about the same as that of a semiconductor wafer. "Die level" means a process conducted on a singulated semiconductor component. "Chip scale" means a semiconductor component having an outline about the same as that of a semiconductor die.

Figure 1A:
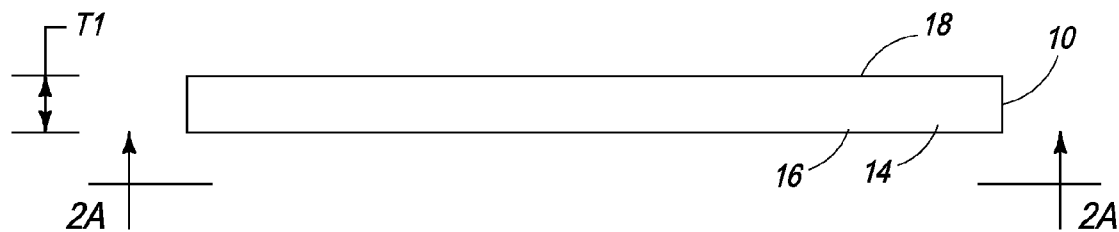
FIGS. 1A-1D are schematic cross sectional views illustrating steps in a method for fabricating thinned semiconductor components using back side laser processing to form lasered features.

Referring to FIGS. 1A-1D, steps in a method for fabricating thinned semiconductor components 58 (FIG. 1D) using back side laser processing are illustrated. Initially, as shown in FIGS. 1A and 2A, a semiconductor wafer 10 containing a plurality of semiconductor dice 12 can be provided. Although in the illustrative embodiment, the method is performed on an entire semiconductor wafer 10, it is to be understood that the method can be performed on a portion of a semiconductor wafer 10, on a panel, or on any other substrate that contains semiconductor dice or components. As another alternative, for fabricating interconnects the method can be performed on a blank semiconductor wafer containing no active semiconductor dice.

The semiconductor wafer 10 can comprise a conventional semiconductor wafer having a standard diameter and a full thickness (T1). By way of example, a 150 mm diameter wafer has a full thickness (T1) of about 675 μm, a 200 mm diameter wafer has a full thickness (T1) of about 725 μm, and a 300 mm diameter wafer has a full thickness (T1) of about 775 μm. In the illustrative embodiment, the semiconductor wafer 10 comprises silicon (Si). However, the semiconductor wafer 10 can comprise another material such GaAs, SiC or sapphire.

The dice 12 can comprise conventional semiconductor dice having a desired configuration, and formed using conventional semiconductor fabrication processes. For example, each die 12 can comprise a dynamic random access memory (DRAM), a static random access memory (SRAM), a flash memory, a microprocessor, a digital signal processor (DSP) or an application specific integrated circuit (ASIC). In addition, each die 12 can have any polygonal shape. In the illustrative embodiment, the dice 12 are generally square in shape, but other polygonal shapes, such as rectangular or hexagonal can also be utilized. Using laser dicing in combination with the method a wider range of shapes for each die 12 can be effected (e.g., triangular, oval, circular).

As shown in FIG. 1A, the wafer 10 and each die 12 includes a semiconductor substrate 14 having a circuit side 16 (first side) wherein integrated circuits 23 (FIG. 1E) and associated circuitry are located, and a back side 18 (second side). The circuit side 16 and the back side 18 are the major planar surfaces of the wafer 10 and the dice 12. In addition, the dice 12 are separated by streets 20 (FIG. 2A) formed on the circuit side 16 of the wafer 10. Further, as shown in FIG. 2A, each die 12 includes a pattern of die contacts 22 formed on the circuit side 16 in a selected pattern, such as a dense area array, in electrical communication with integrated circuits 23 (FIG. 1E) in the semiconductor substrate 14. As shown in FIG. 1E, each die 12 can include redistribution conductors 25, device bond pads 27, and internal conductors 29, configured to establish electrical communication between the die contacts 22 and the integrated circuits 23. As also shown in FIG. 1E, each die 12 can include an inner dielectric layer 31, and an outer dielectric layer 33 which electrically insulates the redistribution conductors 25. All of these elements are conventional in the art, and can be formed using conventional semiconductor fabrication processes.

Figure 1B:
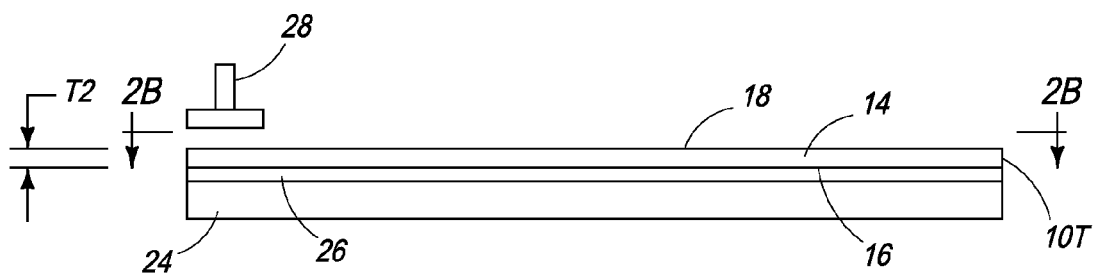
Figure 2A:
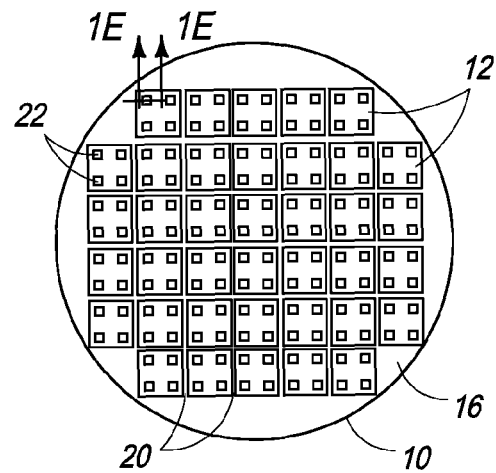
FIG. 2A is a schematic view taken along line 2A-2A of FIG. 1A illustrating a circuit side of the semiconductor wafer.
Figure 2B:
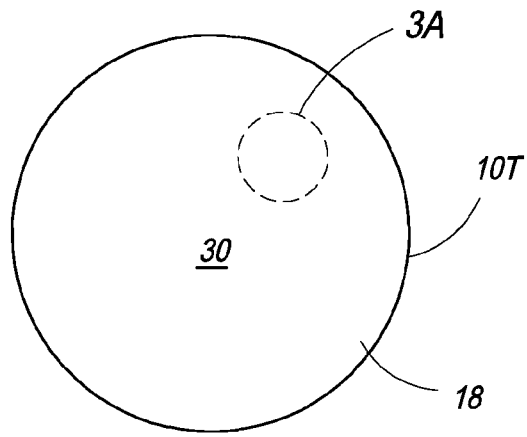
FIG. 2B is a schematic view taken along line 2B-2B of FIG. 1B illustrating a back side of the semiconductor wafer.

Next, as shown in FIG. 1B, a thinning step can be performed on the back side 18 of the wafer 10 to form a thinned semiconductor wafer 10T. For performing the thinning step, the wafer 10 can also be attached to a carrier 24, such as a conventional glass or silicon carrier. The wafer 10 can be attached to the carrier 24 with the circuit side 16 bonded to the carrier 24, and with the back side 18 exposed for thinning. The wafer 10 can be attached to the carrier 24 using a carrier adhesive 26, such as a double sided tape, or a spin coat adhesive, which can be de-bonded using UV radiation for a glass carrier, or thermal radiation for a silicon carrier. However, the carrier is optional as the wafer 10 can be thinned without using a carrier.

The thinning step can be performed using a mechanical planarization process, such as dry polishing, performed with a mechanical planarization apparatus 28. Suitable mechanical planarization apparatus are manufactured by Accretec of Bloomfield, Mich., and Disco Corporation of Santa Clara, Calif. The thinning step can also be performed using a chemical mechanical planarization (CMP) apparatus, or using an etch back process, such as a wet etch process, a dry etch process or a plasma etching process, either performed alone or in combination with mechanical planarization. The thickness T2 of the thinned wafer 10T can be selected as desired with from 35 μm to 150 μm being representative, and less than 100 μm being preferred. The back side 18 of the thinned wafer 10T has a smooth, polished surface, and is devoid of features. The thinned wafer 10T can be susceptible to bowing particularly if other features, such as circuit side and back side redistribution (RDL) layers, are added.

Figure 1C:
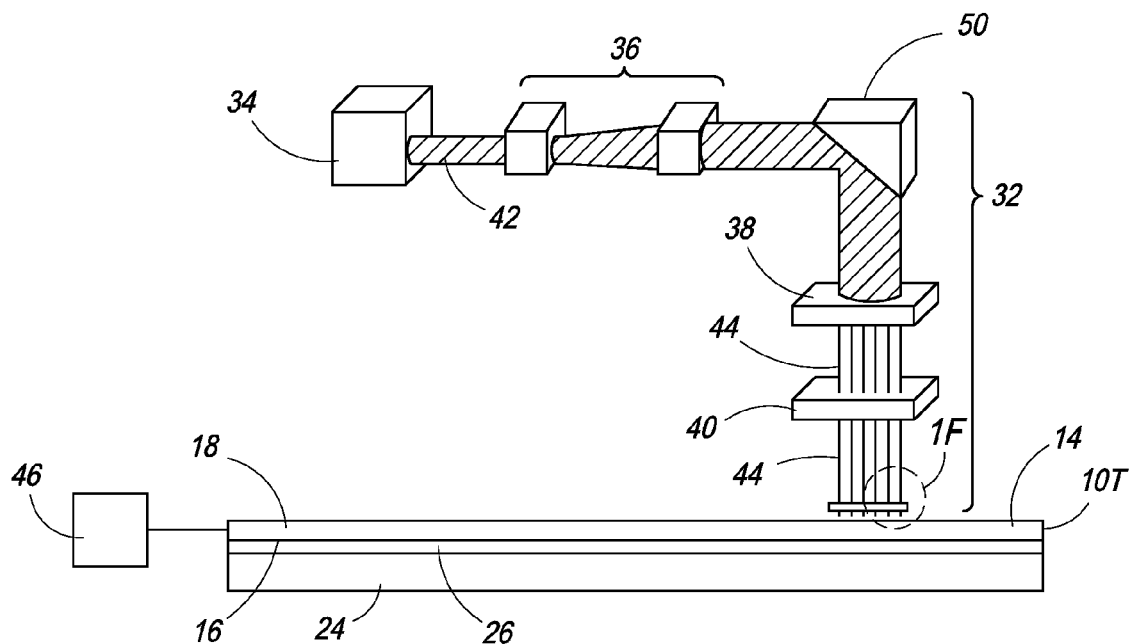

Next, as shown in FIG. 1C, a laser processing step is performed on the backside 18 of the thinned wafer 10T using a laser system 32. As shown in FIG. 1F, the laser processing step can be used to form a textured surface comprised of lasered features 48 on the backside 18 of the thinned wafer 10T. As will be further explained, the laser processing step can also be performed to form different types of lasered features, configured to accomplish a variety of structural and functional changes on the thinned wafer 10T and dice 12, particularly on areas of the back side 18 of the thinned wafer 10T. For example, laser processing can be used to form lasered features which incorporate materials such as dopants and fillers into selected areas on the entire the back side 18 of the thinned wafer 10T. In this case, the lasered features may not be visible geometrical features, but the physical or electrical characteristics of the silicon has been changed to accomplish a desired purpose (e.g., carrier modification, gettering properties, mechanical properties, visual properties). As another example, the laser processing step can be performed to melt and re-solidified the silicon into re-cast lasered features having a different crystal lattice structure (e.g., amorphous silicon to polysilicon). Again the lasered features formed by the re-solidified material can have desired physical or electrical characteristics relative to material that has not been laser processed.

The laser processing step can be performed using a variety of conventional laser systems used in the art. In the illustrative embodiment, the laser system 32 includes a laser source 34 configured to produce a laser beam 42, an expander 36 configured to expand the laser beam 42, a lens system 50 configured to redirect the expanded laser beam 42 by ninety degrees, a DOE (diffractive optical element) 38 configured to separate the laser beam 42 into a plurality of separate laser beams 44, and a focusing device 40 configured to focus the laser beams 44 onto the back side 18 of the thinned wafer 10T. The laser system 32 can also include a wafer handler 46 configured to align and move the thinned wafer 10T past the laser beams 44. One suitable laser system 32 is commercially available from ALSI (Advanced Laser Separation International) located at Platinawerf 20-G, Beunigen 6641 TL, Netherlands. This laser system 32 is designed to dice semiconductor wafers but can be adapted to perform the present laser processing step. The operational parameters of the laser system 32 can be selected as required depending on the application.

Figure 1F:
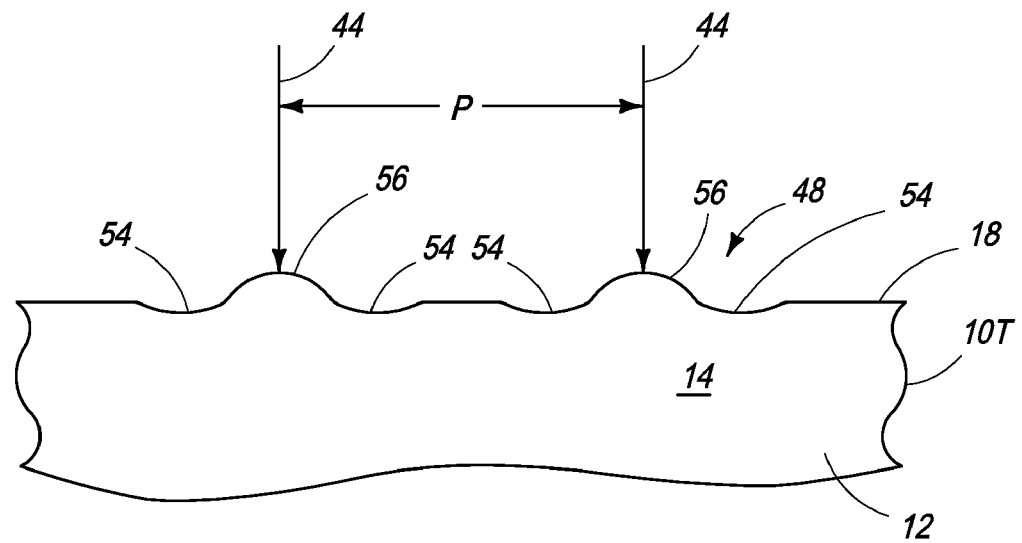
FIG. 1F is an enlarged schematic cross sectional view taken along line 1F of FIG. 1C illustrating a laser processing step.
Figure 2C:
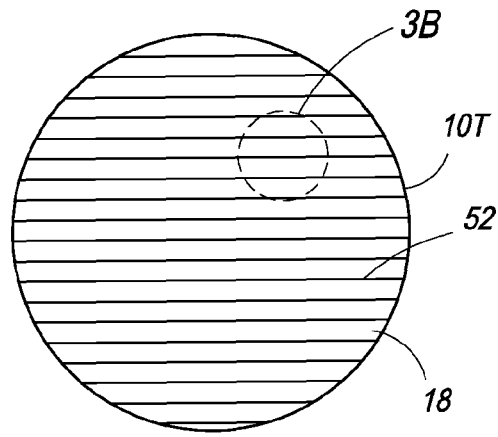
FIG. 2C is a schematic view taken along line 2C-2C of FIG. 1D illustrating the back side of the semiconductor wafer following the laser processing step.

As shown in FIG. 2C, the thinned semiconductor wafer 10T can be moved past the focusing device 40 (FIG. 1C) such that the lasered features 48 (FIG. 1F) are formed along parallel, spaced scan lines 52. Each lasered feature 48 (FIG. 1F) can be formed using from one to several laser pulses directed at the same location. The horizontal scan lines 52 are generally parallel to the horizontal edges 60 of the dice 12, and generally orthogonal to the vertical edges 62 of the dice 12. As the lasered features 48 (FIG. 1F) have micron sized dimensions, they are not visible to the naked eye, or in the scale of FIG. 2C. On the other hand, FIG. 3B has a scale of about 100× actual size, such that the lasered features 48, and their orientation along the scan lines 52 relative to the edges of the semiconductor dice 12, are visible. In FIG. 3C, the cross sectional shape of the lasered features 48 is visible.

Figure 3A:
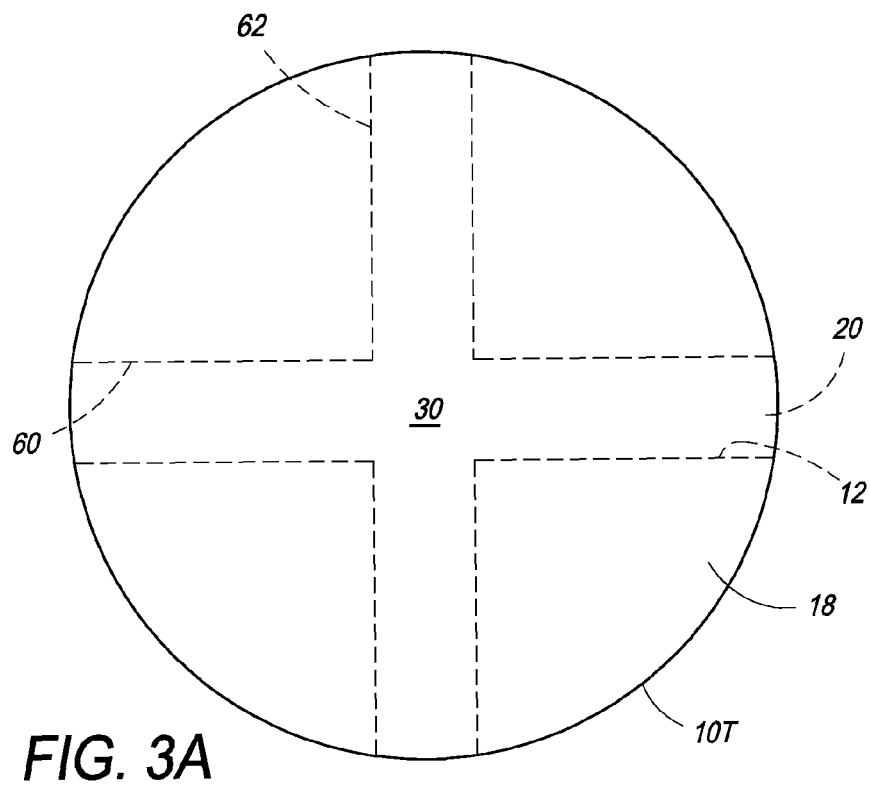
FIG. 3A is an enlarged schematic view taken along line 3A of FIG. 2B illustrating the back side of the semiconductor wafer following a thinning step.
Figure 3B:
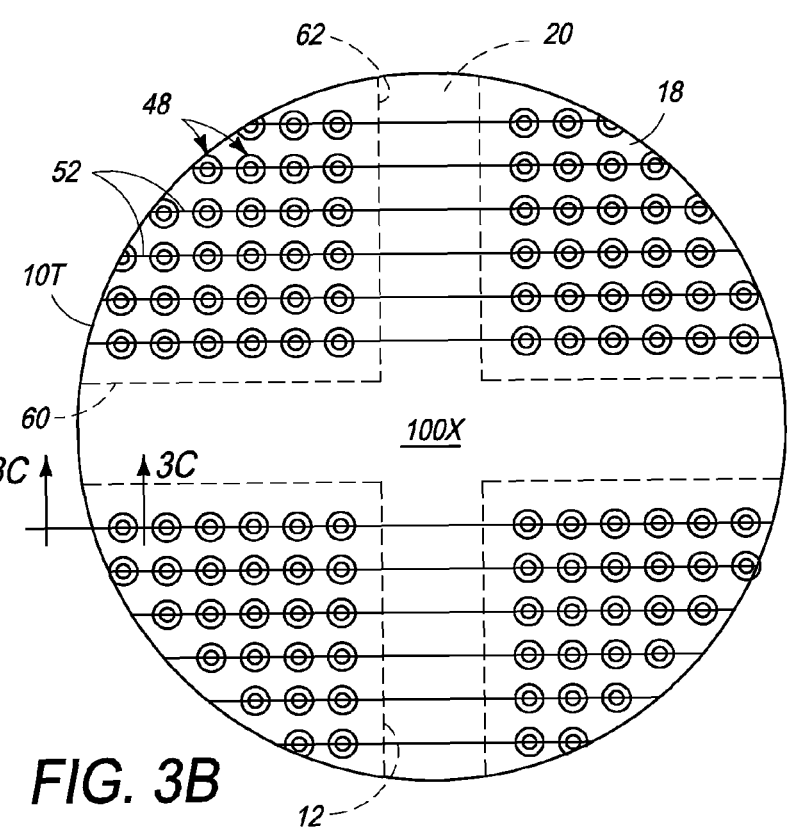
FIG. 3B is an enlarged schematic view taken along line 3B of FIG. 2C illustrating the back side of the semiconductor wafer following the laser processing step.
Figure 3C:
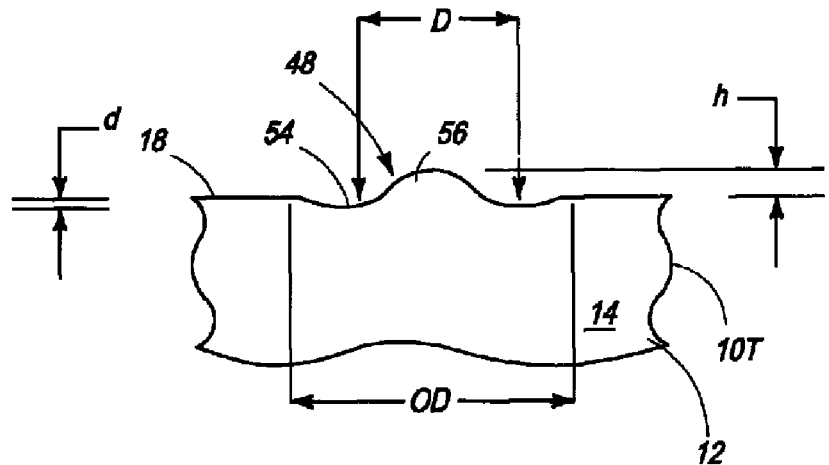
FIG. 3C is an enlarged schematic cross sectional view taken along line 3C-3C of FIG. 3B illustrating a lasered feature on the back side of the semiconductor wafer following the laser processing step.

As shown in FIG. 3B, the lasered features 48 can be formed on the entire back side 18 of the thinned semiconductor wafer 10T, or within the footprint of each individual semiconductor die 12, and in a repetitive straight line pattern equally spaced along the scan lines 52. However, the location and the pattern of the lasered features 48 can be selected for particular applications. For example, the lasered features 48 can be formed on only selected portions of the semiconductor wafer 10T and dice 12 (e.g., along the edges, in the corners, in the middle, away from active devices or circuitry, in the streets). The lasered features 48 can also be formed in different patterns than the straight line pattern of FIG. 3B (e.g., along curves). In addition, a plurality of the lasered features 48 can be located in particular areas of the semiconductor wafer 10T and dice 12 to form selected geometrical shapes (e.g., circles, squares, triangles or any geometrical shape).

As shown in FIG. 3C, each lasered feature 48 can include a shallow, donut-shaped groove 54, which extends into the back side 18 of the thinned wafer 10T with a depth (d). Each lasered feature 48 (FIG. 3C) can also include a bump 56 (or elevated feature) surrounded by the groove 54, which has a height (h) relative to the back side 18 of the thinned wafer 10T. In the illustrative embodiment, the bump 56 is elevated and shaped like a bell or a hillock, but other shapes are possible (e.g., elevated, conical, pyramidal, spherical). Also in the illustrative embodiment, each lasered feature 48 can have a selected pitch (P) and an outside diameter (OD) of about 4-8 µm. The groove 54 can have a depth (d) of about 0.25 to 1.0 µm, the bump 56 can have a base diameter (D) of about 4-6 µm, and the bump 56 can have a height (h) of about 1-2 µm. However, these dimensions are exemplary, and the lasered features 48 can be formed with other dimensions and shapes as well.

It is theorized that the bumps 56 of the lasered features 48 (FIG. 3C) are formed by molten material, which is produced by localized heating of the semiconductor substrate 14 by energy from the laser beam 44, collecting and re-solidifying with an elevated topography. Depending on the conditions, the re-solidified material can comprise polysilicon or amorphous silicon. It is theorized that the grooves 54 are formed by the attraction of molten material from the semiconductor substrate 14 into the bumps 56.

For some applications one or more additional elements can also be incorporated into the bumps 56 or onto other selected areas of the back side 18 of the thinned wafer 10T. For example, during laser processing one or more additional elements, such as dopants and fillers, in solid, gas or liquid form can be incorporated into the liquid or semi-liquid phase silicon. Upon re-solidification, the incorporated element can perform a desired function, such as carrier modification, visual contrast or strengthening for different applications such as laser marking. Also, during (or following) laser processing it may be necessary to balance the inherent circuit side stresses on the wafer 10T and dice 12 with the newly formed back side stresses, to achieve flatness, uniformity and planarity in the wafer 10T and dice 12. For example, stress balancing can be achieved using fillers, or structures, on the circuit side 16 and the back side 18 of the wafer 10T, or only on selected areas thereof (e.g., proximate to the edges).

Figure 1D:
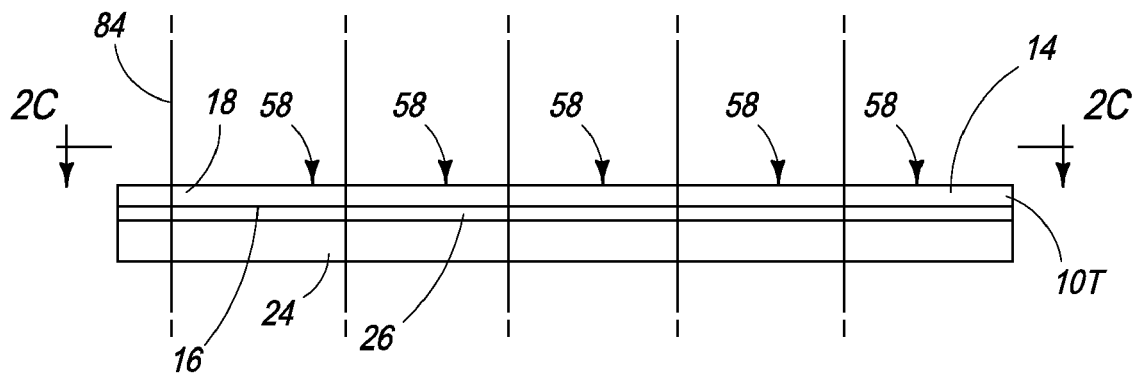
Figure 1E:
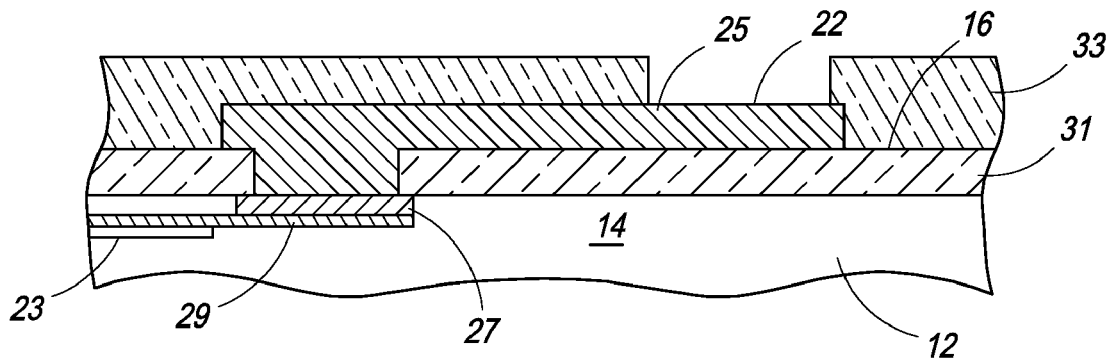
FIG. 1E is an enlarged schematic cross sectional view taken along line 1E-1E of FIG. 2A illustrating integrated circuits and associated circuitry on a semiconductor wafer.

Referring to FIG. 1D, following the laser processing step (FIG. 1C), the thinned semiconductor wafer 10T can be diced along dicing lines 84 to form a plurality of chip scale semiconductor components 58. Dicing can be accomplished using a process such as lasering, sawing, water jetting or etching. Following the dicing step, the semiconductor components 58 can be removed from the carrier 24. Each singulated semiconductor component 58 has a footprint corresponding to a semiconductor die 12 (FIG. 2A) and includes a pattern of lasered features 48 (FIG. 3C) on the back side 18 thereof.

The lasered features 48 (FIG. 3C) help to counteract bowing in the thinned semiconductor wafer 10T, and in singulated semiconductor components 58. In particular, a thinned semiconductor wafer that has not been laser processed, and the singulated semiconductor components from the wafer, may bow upward in the shape of a smile (i.e., generally convex shape). On the other hand, the thinned semiconductor wafer 10T having lasered features 48 (FIG. 3C), and the singulated semiconductor components 58 (FIG. 1D) from the wafer 10T may bow by a lesser amount, with the bow direction being downward in the shape of a frown (i.e., generally concave shape). Bowing can also be counteracted by balancing the front side stresses with the back side stresses.

Figure 4:
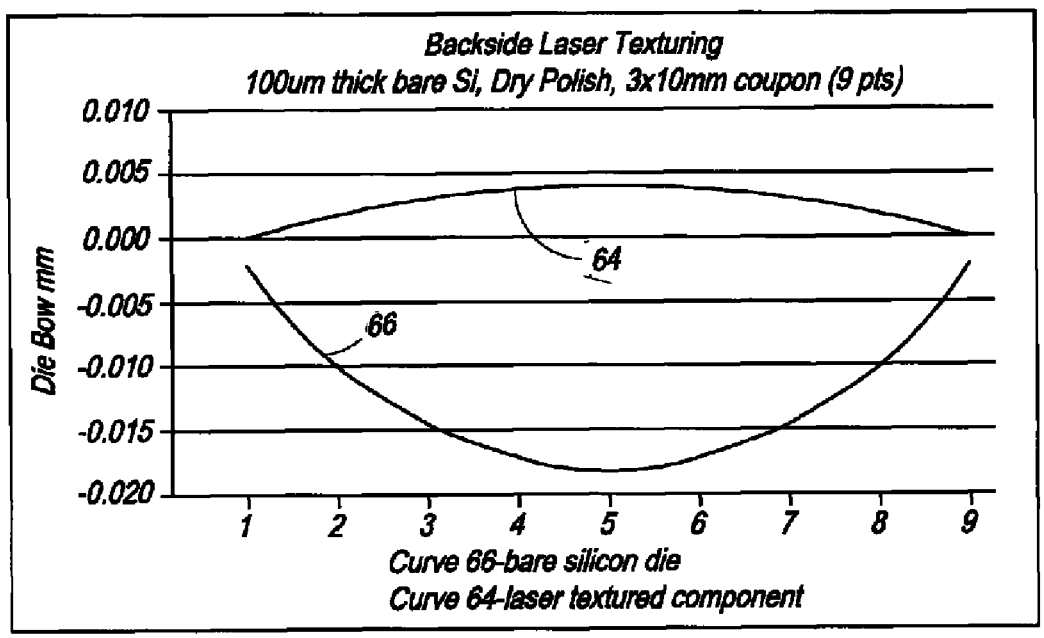
FIG. 4 is a graph illustrating die bow in mm for nine points for a bare silicon die and for a component having a pattern of laser textured features on the back side.

Referring to FIG. 4, experimental data on die bow for a thinned silicon die, or an interconnect, having no active circuitry, that has been laser processed with lasered features to form a laser textured component is illustrated. The bare semiconductor die was a 3 mm×10 mm silicon die singulated from a blank wafer that had been dry polished (i.e., thinned) to a thickness of about 100 µm. The semiconductor component was a 3 mm×10 mm blank die from the same blank wafer but with the previously described laser processing step to form lasered features on the back side thereof substantially as previously described for laser features 48 (FIG. 3C). In FIG. 4, the vertical axis (y axis) represents Die Bow in (mm) for the die or the component. The horizontal axis (x axis) represents measured points (1-9) on the die or the component, with points 1 and 9 being proximate to the edges, and point 5 being proximate to the center. As represented by curve 66 in FIG. 4, a thinned bare semiconductor die that has not been laser processed, bows in the shape of a smile (i.e., generally convex shape) with the center of the die deflected from the zero plane (0.000) by about (−0.019) mm. As represented by curve 64 in FIG. 4, a thinned component having lasered features bows in the shape of a frown (i.e., generally concave shape) with the center of the component deflected from the zero plane by about (0.005) mm.

In addition to counteracting bowing in the thinned semiconductor wafer 10T, and in the semiconductor components 58 (FIG. 1D), the lasered features 48 (FIG. 3C) also provide an increased surface area for heat dissipation during operation of the semiconductor components 58 (FIG. 1D). In addition, the increased surface area facilitates adhesion of the back sides 18 of the semiconductor components 58 (FIG. 1D) for packaging and other processes. The lasered features 48 (FIG. 3C) also provide defect sites on the back sides 18 of the semiconductor components 58 (FIG. 1D) for trapping contaminants and improving the functionality of the semiconductor components 58 (FIG. 1D). As will be further explained, the semiconductor components 58 (FIG. 1D) can also include a separate gettering layer 102 (FIG. 7E) formed by laser processing.

Figure 5A:
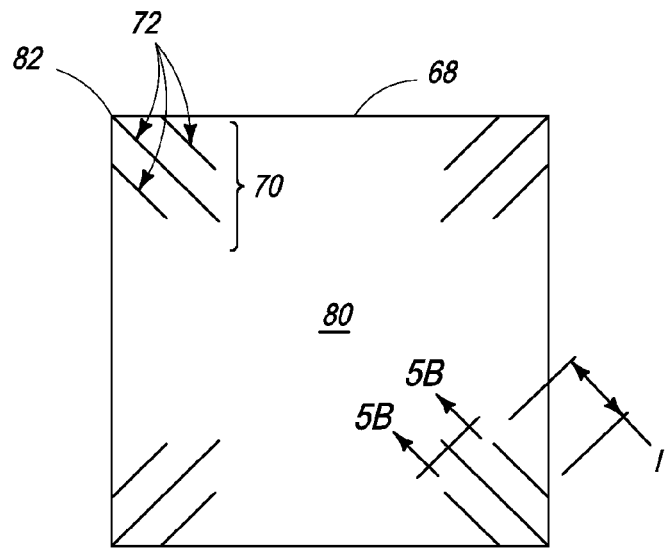
FIG. 5A is a schematic bottom view of a singulated semiconductor component illustrating patterns of lasered features in the corners configured to rigidify and reduce bowing of the corners.
Figure 5B:
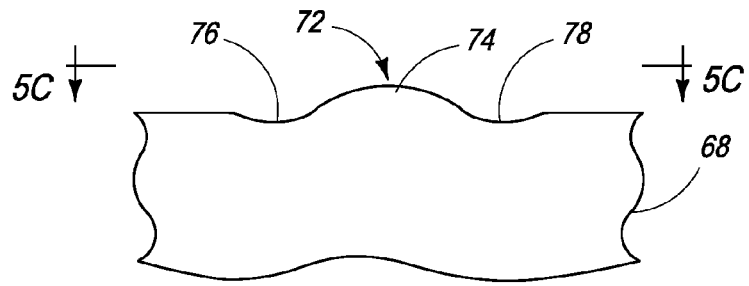
FIG. 5B is an enlarged schematic cross sectional view taken along line 5B-5B of FIG. 5A illustrating a lasered feature.
Figure 5C:
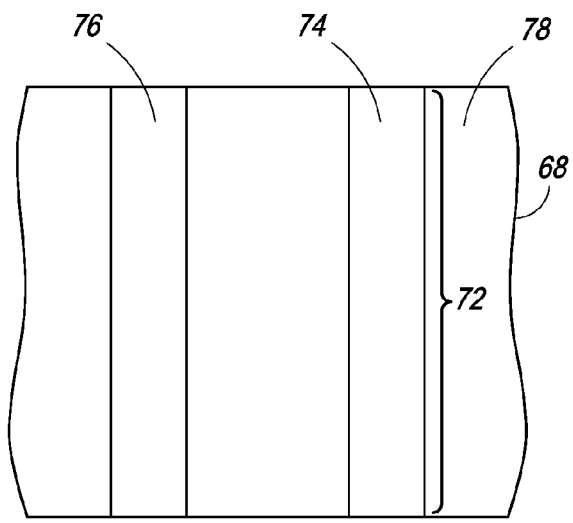
FIG. 5C is an enlarged schematic plan view taken along line 5C-5C of FIG. 5B illustrating the lasered feature.

Referring to FIGS. 5A-5C, a semiconductor component 68 having patterns 70 (FIG. 5A) of elongated laser textured features 72 on a back side 80 (FIG. 5A) thereof is illustrated. The elongated laser features 72 are located proximate to the corners 82 (FIG. 5A) of the component 68, and function to rigidify and prevent flexure of the corners 82. Each pattern 70 includes a plurality of elongated lasered features 72 in a generally parallel, spaced array. As shown in FIGS. 5B and 5C, each elongated lasered feature 72 includes an elongated ridge 74 and parallel spaced grooves 76, 78 on either side of the ridge 74. The elongated lasered features 72 can be formed substantially as previously described for lasered feature 48 (FIG. 3C) but with the laser processing step configured to form the ridge 74 and the grooves 76, 78 with a length (1) of from several microns to several centimeters or more.

Figure 6:
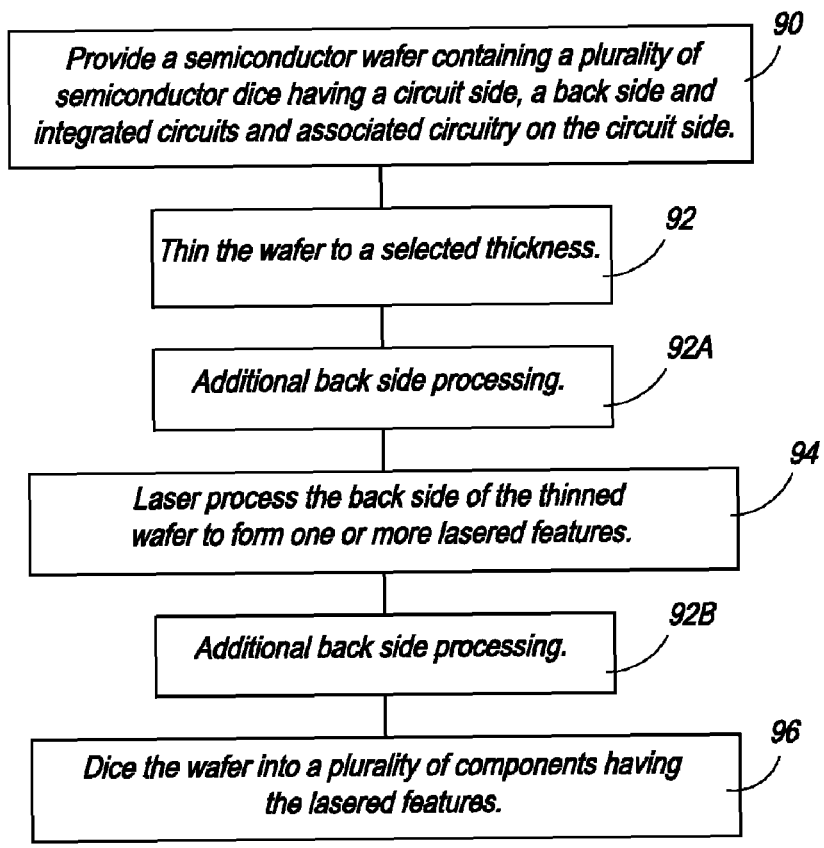
FIG. 6 is a process flow chart of the method.

Referring to FIG. 6, the previously described method is illustrated in a process flow chart. The process flow includes the following sequence of steps.

Step 90—Provide a semiconductor wafer containing a plurality of semiconductor dice having a circuit side, a back side and integrated circuits and associated circuitry on the circuit side.

Step 92—Thin the wafer to a selected thickness.

Step 92A—Optionally, additional back side processing can be performed on the back side of the thinned wafer. The additional back side processes can include surface etching, such as chemical etching the entire back side, or selected areas thereof. Other back side processes can include surface cleaning, laser marking and screen printing of additional back side features. Other additional back side processes can include adding elements, such as dopants and fillers, to the back side of the thinned wafer.

Step 94—Laser process the back side of the thinned wafer to form one or more lasered features.

Step 92B—Optionally, additional back side processing can be performed on the back side of the laser processed wafer, substantially as previously described for step 92A. As another optional step, precut swatches of precured polymer film, as disclosed in U.S. Pat. No. 4,906,314, can be applied to the back side of the laser processed wafer.

Step 96—Dice the wafer into a plurality of components having the lasered features. The dicing step can be performed using a sawing process, a liquid jet process or a laser dicing process. With laser dicing the dicing step can be performed either prior to or after the laser processing step.

Figure 7A:
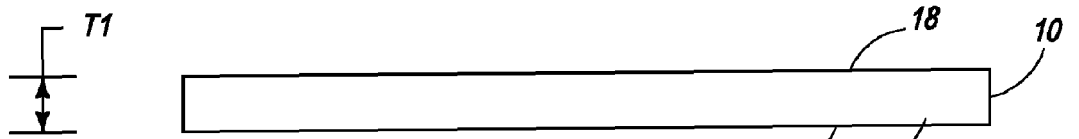
FIGS. 7A-7E are schematic cross sectional views illustrating steps in a method for fabricating thinned semiconductor components using back side laser processing to form a gettering layer.
Figure 7B:
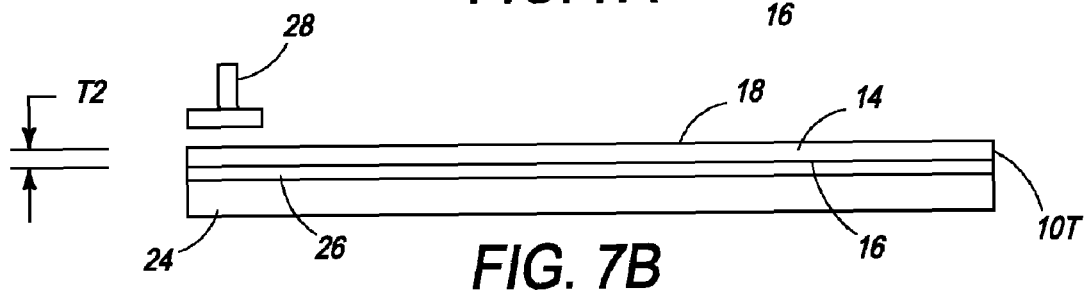

Referring to FIGS. 7A-7E, a method for fabricating thinned semiconductor components 100 (FIG. 7E) using back side laser processing to form lasered features in the form of a gettering layer 102 (FIG. 7E) is illustrated. Initially, as shown in FIG. 7A, a semiconductor wafer 10 having a thickness of T1 and containing a plurality of semiconductor dice 12 can be provided, substantially as previously described. In addition, as shown in FIG. 7B, the wafer 10 can be thinned on the carrier 24 from the back side 18 to form a thinned semiconductor wafer 10T having a thickness of T2, substantially as previously described.

Figure 7C:
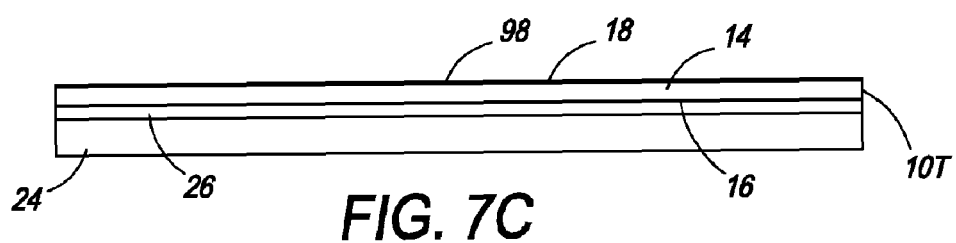

Next, as shown in FIG. 7C, a spin on dopant 98 can be applied to the back side 18 of the thinned semiconductor wafer 10T. Spin on dopants are liquid solutions which can be used to form doped silicon like layers. The spin on dopant can be applied to the back side 18 of the thinned semiconductor wafer 10T by a spin coating process. For performing the spin coating process the solution can be dispensed onto the wafer 10T, which is then spun rapidly using a spin coater to evenly distribute the solution. The thickness of the resulting deposited material depends on the viscosity of the solution and the spin speed. Suitable dopants include phosphorus, boron and arsenic. The dopant concentration can be varied by dilution with organic solvents (e.g., ethyl alcohol).

Figure 7D:
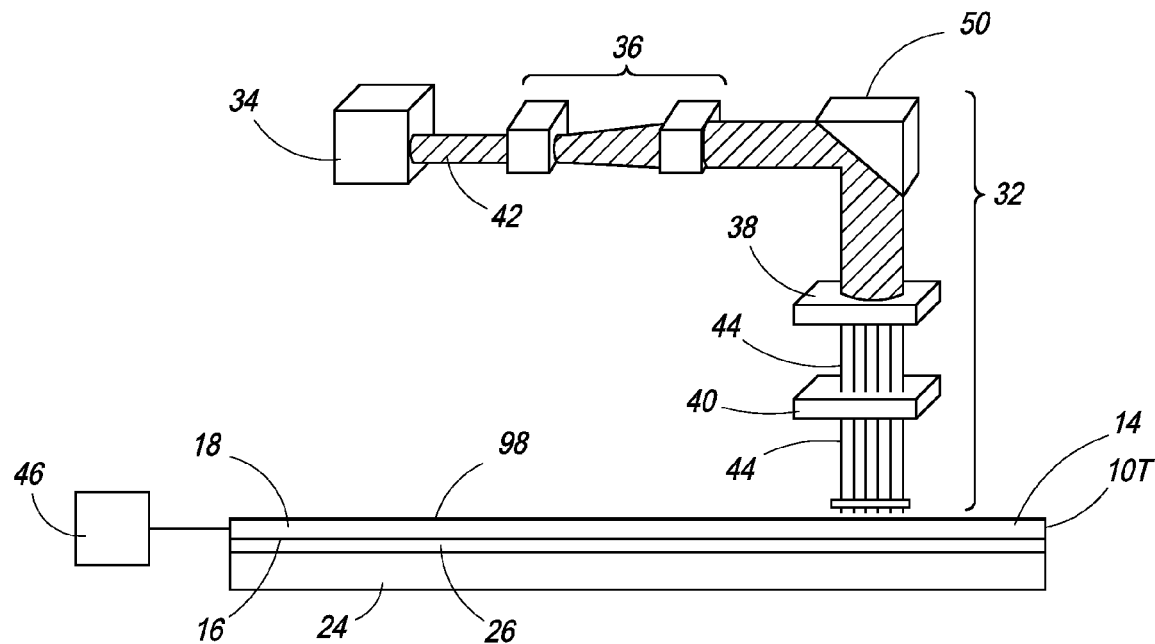

Next, as shown in FIG. 7D, the laser system 32 can be used to drive the dopant in the spin on dopant 98 into the semiconductor substrate 14. In this case, the drive in mechanism is diffusion caused by heating of the semiconductor substrate by the laser beams 44 to a required temperature, for a desired time period, for a desired effect. However, the heating can remain localized, such that the integrated circuits 23 (FIG. 1E), internal conductors 29 (FIG. 1E) and redistribution conductors 25 remain substantially unaffected.

Figure 7E:
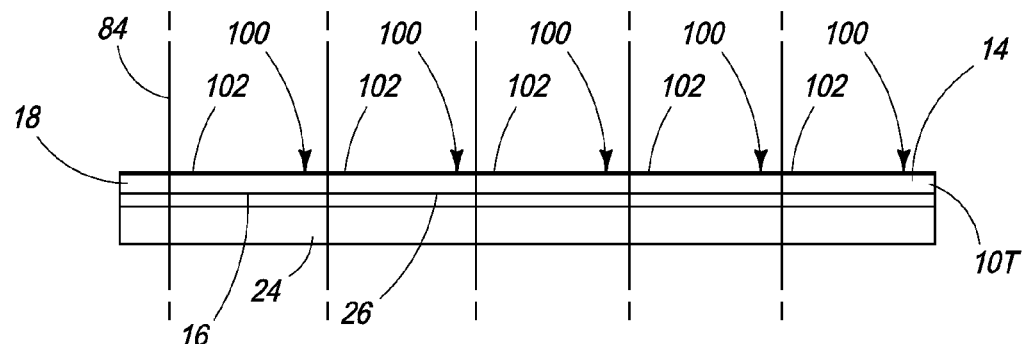

Next, as shown in FIG. 7E, the thinned semiconductor wafer 10T can be diced into a plurality of singulated semiconductor components 100, substantially as previously described. Each semiconductor component 100 includes a gettering layer 102 on the back side 18 thereof containing dopants driven into the semiconductor substrate 14 by the laser processing step. The dopants in the gettering layer 102 provide defect sites on the back sides 18 of the semiconductor components 100 for attracting contaminants, and improving functionality. In addition to the gettering layer 102, the semiconductor components 100 can also include lasered features 48 (FIG. 3C) or 72 (FIG. 5B) formed as previously described concurrently with or separately from the gettering layer 102.

Figure 8:
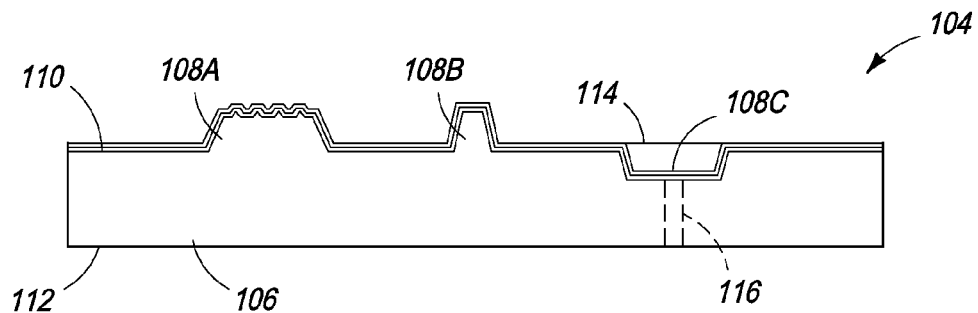
FIG. 8 is a schematic cross sectional view of a thinned semiconductor interconnect fabricated using back side laser processing.

Referring to FIG. 8, the previously described method can also be used to fabricate a thinned interconnect 104. Interconnects can be used to make electrical connections to semiconductor components. For example, semiconductor test systems include an interconnect for making temporary electrical connections to component contacts on the semiconductor components. Depending on the system, the interconnect can be chip sized or wafer sized. Interconnects are also used to make permanent electrical connections to semiconductor components for various electronic assemblies, such as multi chip modules. Interconnects can also include embedded semiconductor devices and integrated circuits.

As shown in FIG. 8, the interconnect 104 includes an interconnect substrate 106 having a circuit side 110 and a back side 112. The interconnect substrate 106 can comprise a semiconductor material, substantially as previously described for the semiconductor substrate 14 (FIG. 1A). However, in this case the interconnect substrate 106 do not necessarily include integrated circuits, which can be embedded separately using a separate circuit substrate 114. The interconnect substrate 106 includes a plurality of interconnect contacts 108A, 108B, 108C on the circuit side 110 configured to make electrical connections with semiconductor components (or alternately to the circuit substrate 114). For illustrative purposes, three types of interconnect contacts 108A, 108B, 108C are illustrated. However, in actual practice the interconnect substrate 106 may only include one type of interconnect contact 108A, 108B, or 108C.

As shown in FIG. 8, the interconnect contact 108A can comprise a metallized pillar configured to contact a flat planar component contact such as a bond pad or redistribution pad. The interconnect contact 108B can comprise a metallized pillar configured to penetrate a raised component contact such as a metal bump or ball. The interconnect contact 108C can comprise a metallized recess configured to contact a raised component contact such as a metal bump or ball. Alternately, the interconnect contact 108C can be configured to physically and electrically contact the circuit substrate 114. U.S. Pat. No. 7,129,156 B2, which is incorporated herein by reference, further describes the interconnect contacts 108A, 108B and 108C, and suitable methods of fabrication. U.S. Pat. No. 7,498,675 B2, which is incorporated herein by reference, further describes components having conductive vias, and additional circuit elements, such as back side redistribution layers, in electrical communication with the conductive vias.

As shown in FIG. 8, the interconnect contact 108C can also include a conductive via 116 through the interconnect substrate 106 configured to make back side electrical connections to the interconnect contact 108C and the circuit substrate 114. For example, the via 116 can be placed in electrical communication with electrodes on a module substrate or test fixture. The interconnect contacts 108A and 108B can also include conductive vias configured to make back side electrical connections. The circuit substrate 114 can comprise a thinned semiconductor die, or portion thereof, configured to fit in the interconnect contact 108C in electrical communication with the conductive via 116.

The back side 112 of the interconnect substrate 106 can be thinned and then laser processed with lasered features substantially as previously described for the thinned wafer 10T (FIG. 1C). The lasered features can be used to rigidify the interconnect 108 and to increase the surface area of the back side 112, substantially as previously described. Further, the laser processing of the back side 112 can be performed to not affect the interconnect contacts 108A, 108B, 108C on the circuit side 110.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for fabricating a semiconductor component comprising:
   providing a semiconductor substrate having a circuit side, a back side and integrated circuits and circuitry on the circuit side;
   thinning the substrate from the back side to a selected thickness to form a thinned substrate having circuit side stresses generated by the integrated circuits and the circuitry; and
   laser processing the back side of the thinned substrate to form a textured surface comprising a plurality of lasered features on the back side, with a location and a geometry of the lasered features selected to counteract bowing of the thinned substrate from the circuit side stresses.

2. The method of claim 1 wherein each lasered feature has an outside diameter of about 4-8 μm, a height of about 1-2 μm and a depth of about 0.25-1.0 μm.

3. The method of claim 1 further comprising following the thinning step performing additional back side processing on the back side of the thinned substrate.

4. The method of claim 1 wherein each lasered feature has a bell or hillock shape.

5. The method of claim 1 wherein the lasered features are formed in a plurality of separate patterns on the back side.

6. The method of claim 1 further comprising laser dicing the thinned substrate either prior to or after the laser processing step.

7. The method of claim 1 wherein the lasered features are configured to equalize the circuit side stresses the back side stresses.

8. A method for fabricating semiconductor components comprising:
   providing a semiconductor substrate having a circuit side, a back side and integrated circuits and circuitry on the circuit side;
   thinning the substrate from the back side to a selected thickness to form a thinned substrate having circuit side stresses generated by the integrated circuits and the circuity;
   laser processing the back side to form a plurality of patterns of lasered features on the back side, with the patterns of lasered features located on the back side to generate back side stresses for counteracting bowing of the thinned substrate from the circuit side stresses; and
   dicing the substrate into the semiconductor components with each component having at least one pattern of lasered features.

9. The method of claim of claim 8 wherein the substrate includes a plurality of edges and the patterns of lasered features are located parallel to the edges.

10. The method of claim 8 wherein the substrate includes a plurality of corners and the patterns of lasered features are located only in the corners.

11. The method of claim 8 wherein the substrate comprises a semiconductor wafer containing a plurality of semiconductor dice.

12. The method of claim 8 wherein the laser processing step is performed using a laser system configured to produce a laser beam comprising an expander configured to expand the laser beam, a lens system configured to redirect the laser beam, a diffractive optical element configured to separate the laser beam into a plurality of separate laser beams and a focusing device configured to focus the laser beam.

13. The method of claim 8 wherein each pattern comprises a parallel spaced array of ridges and grooves.

14. The method of claim 8 further comprising prior to the laser processing step performing additional back side processing on the back side of the substrate.

15. The method of claim 8 wherein the thinning step is performed using a method selected from the group consisting of mechanical planarization, chemical mechanical planarization and etching, and the selected thickness is less than 100 μm.

16. A method for fabricating semiconductor components comprising:
   providing a semiconductor substrate having a circuit side, a back side and integrated circuits and circuitry on the circuit side;
   providing a laser system configured to produce a laser beam comprising an expander configured to expand the laser beam, a lens system configured to redirect the laser beam, a diffractive optical element configured to separate the laser beam into a plurality of separate laser beams and a focusing device configured to focus the laser beam;
   thinning the substrate from the back side to a selected thickness to form a thinned substrate having circuit side stresses generated by the integrated circuits and the circuitry;
   selecting operational parameters of the laser system and laser processing the back side using the laser system and the operational parameters to form a plurality of lasered features on the back side configured to counteract bowing of the thinned substrate from the circuit side stresses; and
   dicing the substrate into the semiconductor components.

17. The method of claim 16 wherein the lasered features are formed along parallel spaced scan lines.

18. The method of claim 17 wherein the scan lines are parallel to edges of the substrate.

19. The method of claim 18 wherein the laser system is also configured to perform the dicing step.

* * * * *

UNITED STATES PATENT AND TRADEMARK OFFICE
CERTIFICATE OF CORRECTION

| | |
|---|---|
| PATENT NO. | : 8,187,983 B2 |
| APPLICATION NO. | : 12/424726 |
| DATED | : May 29, 2012 |
| INVENTOR(S) | : Alan G. Wood et al. |

It is certified that error appears in the above-identified patent and that said Letters Patent is hereby corrected as shown below:

On the face page, in field (56), under "Other Publications", in column 2, line 3, delete "Technololgy" and insert -- Technology --, therefor.

In column 9, line 55, in Claim 7, after "stresses" insert -- and --.

In column 9, line 55, in Claim 7, before "back" delete "the".

In column 9, lines 64-65, in Claim 8, delete "circuity;" and insert -- circuitry; --, therefor.

In column 10, line 9, in Claim 9, delete "of claim of claim" and insert -- of claim --, therefor.

Signed and Sealed this
Thirty-first Day of July, 2012

David J. Kappos
*Director of the United States Patent and Trademark Office*